(12) United States Patent
Wan et al.

(10) Patent No.: US 6,806,479 B1
(45) Date of Patent: Oct. 19, 2004

(54) APPARATUS AND METHOD FOR REDUCING IMPLANT ANGLE VARIATIONS ACROSS A LARGE WAFER FOR A BATCH DISK

(75) Inventors: Zhimin Wan, Sunnyvale, CA (US); Jiong Chen, San Jose, CA (US); John D. Pollock, Rowley, MA (US)

(73) Assignee: Advanced Ion Beam Technology, Inc., San Jose, CA (US)

( * ) Notice: Subject to any disclaimer, the term of this patent is extended or adjusted under 35 U.S.C. 154(b) by 0 days.

(21) Appl. No.: 10/641,219

(22) Filed: Aug. 13, 2003

(51) Int. Cl.[7] ............................................. H01J 37/20
(52) U.S. Cl. .......................... 250/492.21; 250/442.11
(58) Field of Search ....................... 250/492.21, 442.11

(56) References Cited

U.S. PATENT DOCUMENTS 6,222,196 B1 * 4/2001 Mack .................... 250/492.21

* cited by examiner

Primary Examiner—Kiet T. Nguyen
(74) Attorney, Agent, or Firm—Bo-In Lin

(57) ABSTRACT

A method to rotate individual pad of a batch disk to an implant angle and lock them in place, with the pad surface having conical or near conical surface to minimize the implant angle variation across a wafer on the pad for both tilt angle and twist angle, at large tilt angle implant. The implanter includes a disk with multiple attached pads that can hold substrates securely when the hub is at rest or rotates. The disk rotates around its spin axis, which moves laterally at a programmed speed profile so that all substrates on the hub can get evenly touched by the fixed ion beam. The pad rotation axis is at an angle with the disk spin axis, and the angle is preferable 90 degrees. The nominal of the pad surface is at an angle, i.e., a tilt angle, relative to the incident ion beam. A rotation mechanism is applied to each individual pad to rotate the pad to the desired tilt angle. A locking mechanism is applied to each individual pad assembly to lock the pad at the desired tilt angle with minimum angle variation under high centrifugal force during fast disk spin. The locking mechanism includes: a) add brake to the rotation mechanism in the pad assembly so that the pad cannot rotate due to mechanical friction force or lock-key. B) use motor to hold the pad assembly. The sum of the friction torque and the motor holding torque should be larger than the centrifugal torque. A torque balancing mechanism is applied to pad mechanical design to minimize the total pad rotation torque under centrifugal force during fast disk spin by adding mass to counter balance the original wafer pad mass.

32 Claims, 9 Drawing Sheets

APPARATUS AND METHOD FOR REDUCING IMPLANT ANGLE VARIATIONS ACROSS A LARGE WAFER FOR A BATCH DISK

BACKGROUND OF THE INVENTION

1. Field of the Invention

The invention relates generally to method and apparatus for ion implantation applying mechanical scanning technology when a spinning batch type disk with multiple wafers (or substrates) moves laterally across a fixed ion beam. More particularly, this invention relates to an improved ion implanting apparatus and method to carry out large angle implantation with reliable angle control to reduce the tilt angle variation across the wafer for a batch type implanter.

2. Descriptions of the Prior Art

Conventional technology of batch type ion implanter is still limited by the technical difficulties of degraded angle integrity due to significant angle variations across the surface of a wafer in carrying out a large angle implantation. The implantation uniformity is degraded as the ion implantation process is carried out with a large tilt angle. Particularly, the difficulties exist in the batch type implanters wherein a rotating disk is implemented to carry multiple wafers, i.e. a batch of wafers. The disk is rotated and also can also be laterally moved across a fixed ion beam to expose the wafers to a uniform dose of the implanting ions over the whole batch of wafers carried on the disk. The system configurations of a batch type implanters were disclosed and described in several Patents, e.g., U.S. Pat. Nos. 5,350,427, 5,124,557, 5,218,209, 6,583,428, 6,593,699. A co-pending patent application Ser. No. 09/513,396 further discloses a batch type implanter that was filed by a common inventor of this Application and hereby incorporated herein as reference. The tilt angle variation of a batch size of 13 wafers across a 300 mm wafer is about ±1.2 degree if the wafer is flat, due to 5 degrees pedestal angle between wafer pad surface normal axis and the disk spin axis. The larger the pedestal angle, the greater is the tilt angle variation across a wafer. However, the pedestal angle of near 5 degree is necessary to keep wafers on the disk against the pads due to spin centrifugal force such that good contacts between the wafers and the pads can enhance the heat dissipation through thermal conductivity between the wafers and pads.

To minimize the tilt angle variation, the pad surface could be concaved, especially as cylindrical surface. In U.S. Pat. No. 6,222,196, Mack discloses an ion implanter including a rotatable support disposed in an implantation chamber of an ion beam implanter for supporting a plurality of wafer work-pieces. The rotatable support includes a hub adapted for rotating about an axis of rotation substantially parallel to a direction of an ion beam line entering the implantation chamber. The rotatable support further includes a plurality of wafer support members adapted to be attached to the hub, each wafer support member adapted to support at least one of the wafer work-pieces. Each wafer support member includes an attachment structure for affixing the support to the rotating member and a wafer support pad extending from the attachment structure and passing through the beam line as the hub rotates. The wafer support pad includes a wafer support surface facing the beam line that includes a concave portion and the concave portion of the wafer support surface is cylindrically shaped. The central axis of the concaved cylinder intersects an axis of rotation of the hub. The radius of curvature of the concave portion is large. For a pad to support a wafer with 300 mm diameter on a batch disk with 13 pads, the radius of curvature is approximately seven meters. Upon rotation of the hub at a predetermined angular velocity, the work-piece conforms to a shape of the concave portion due to a component of centrifugal force normal to a surface of the wafer support surface. However, the ion implanters as disclosed by Mack still have the limitation that the cylindrical surface of the wafer cannot resolve the difficulty of angle implant while maintaining sufficient wafer cooling during implantation. Although the support pad surface can be made cylindrical, it requires very large centrifugal force, or very high spin speed (as high as 2000 rpm), to deform a flat wafer onto cylindrical shape. It is impossible in reality for a batch disk to rotate at the high speed due to mechanical limitation, such as disk balance, disk material strength, and wafer damage by clamp mechanism. If a wafer cannot deform onto the cylindrical pad surface, its thermal contact with the water-cooled pad surface would be very weak and wafer cooling would not be sufficient. The problem of poor wafer cooling will be further discussed below.

The problems of angle variations across a large wafer surface are particularly pronounced when the semiconductor industry moves toward sub-micron node technology and the large angle implantation becomes a requirement for high dosage implantations. The conventional batch type disk cannot provide large angle implant due to large disk dimension in a narrow disk chamber. The largest tilt angle is 10 degrees provided by current commercially available batch type implanters. Two possible solutions are available to overcome these limitations when large angle implant is required using a batch type implanter. The first one is to tilt the whole disk together to an angle as large as 45 deg in a large process chamber. As that disclosed by Takeyama in U.S. Pat. No. 5,218,209 that an ion implanter, as shown in FIGS. 1A and 1B, for implanting ions into a batch of semiconductor wafers that includes a wafer holding disk of the centrifugal holding type with a plurality of wafer rests in the wafer holding disk having a wafer holding surface, which is conically curved. When the wafer holding disk is rotated, the wafer is pushed onto the wafer holding surface so that the surface of the wafer is curved nearly in the same manner as the conically curved inner surface of the peripheral portion of the s wafer holding disk. As a result, an ion beam being irradiated upon the surface of the wafer is kept at a perpendicular direction to the surface of the wafer. Takeyama's method has several drawbacks. Specifically, the configuration enlarges the machine footprint. Furthermore, the beam-to-wafer distance varies at different tilt angle that makes it hard to control beam size at the wafer thus the beam current performance will be greatly reduced at low energy due to beam blow-up. Similar to Mack's invention, this implanter also has a limitation and difficult that there is a poor contact between the wafers and the conical pad surfaces at practical spin speed of <1000 rpm. The heat dissipation of the wafers can be a limitation for the implanter utilizing conically shaped wafer pad surface as that disclosed by Takeyama.

The other method is to tilt each wafer pad on the disk individually to a large angle as that disclosed by Aitken in U.S. Pat. No. 5,124,557. As shown in FIGS. 2A and 2B, Aitken's method requires minimal disk tilt so that its process chamber thickness dimension requirement is similar to the wafer pad diameter. It has no impact on machine footprint, and no beam-to-wafer distance variation. Since each pad can rotate to horizontal position to allow horizontal wafer transfer on and off the pad, which results in better reliability than the vertical wafer transfers. However, the methods and apparatuses as disclosed by Aitken require the individual pad rotation control to vary the implant angle, thus introduces many technical difficulties that have not been resolved by the conventional implanters. Namely, the implanters are required to implement pad angle locking mechanism during fast disk spin, pad surface special design to minimize implant angle variation when a wafer on a tilted pad is passing through a doping ion beam during implant, pad rotation mechanism to overcome friction and mass inertia, and vacuum seal mechanism to separate rotating motors in air and substrate pads in vacuum.

For the above reasons, there are still needs exist in the art of ion implantation to provide improved method and apparatus such that the above-mentioned difficulties and limitations can be resolved.

SUMMARY OF THE PRESENT INVENTION

It is the object of the present invention to provide a new system configuration and method for carrying out batch type ion implantations. The present invention discloses methods and special disk/pad configurations for a batch type implanter to apply large angle implant. The new disk/pad arrangements provide mechanism to rotate each pad to a large angle and lock it in place firmly against the large centrifugal torque trying to rotate the pad back to zero tilt angle, to minimize pad rotation error. Furthermore, this invention provides a method to concave into a wafer surface to follow a concaved pad surface similar to the wafer natural bending shape, with maximum deformation the same as the desired conical pad surface which gives minimal tilt/twist angle variation, to minimize tilt/twist angle variation during disk spinning and at the same time maximize thermal contact between the wafers and the concaved pad surfaces.

A preferred embodiment of this invention discloses a method to rotate individual pad of a batch disk to an implant angle and lock them in place, with the pad surface having a natural bending concaved surface to minimize the implant angle variation across a wafer on the pad for both tilt angle and twist angle, at large tilt angle implant. The implanter of this invention includes a disk with multiple attached pads that can hold substrates securely when the hub is at rest or rotates. The disk rotates around its spin axis, which moves laterally at a programmed speed profile so that all substrates on the hub can get evenly touched by the fixed ion beam. A counter weight is used to counter the centrifugal torque to keep the pad at any desired tilt angle while the disk spins at high speed.

These and other objects and advantages of the present invention will no doubt become obvious to those of ordinary skill in the art after having read the following detailed descriptions of the preferred embodiment that is illustrated in the various drawing figures.

DETAILED DESCRIPTION OF THE METHOD

Figures 1A, 1B:
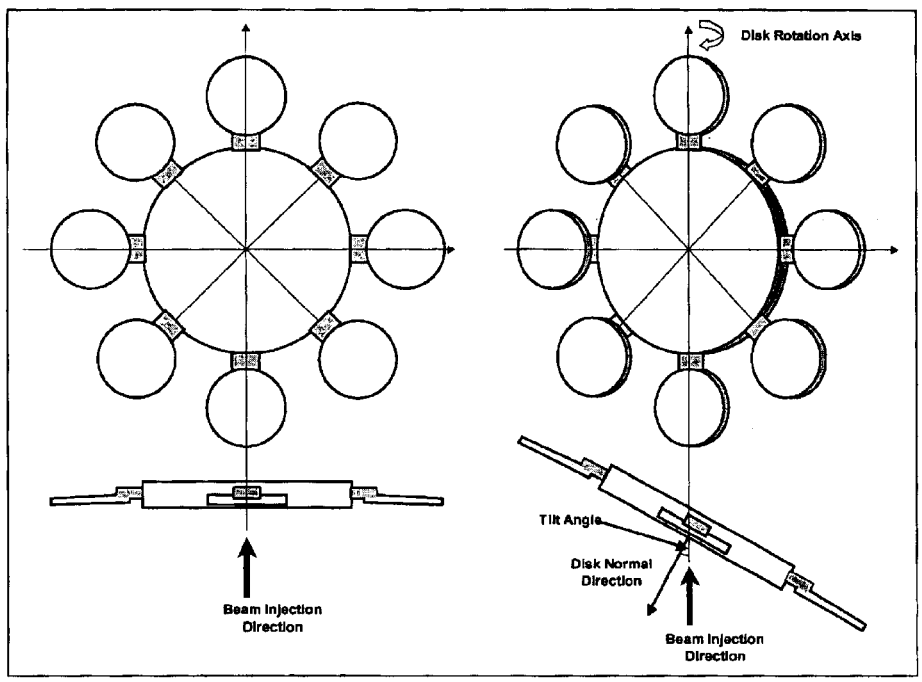
FIG. 1A shows a top view and a side cross sectional views of a conventional rotational disk implemented in a batch type implanter to carry a plurality of wafers.
FIG. 1B shows a top view and a side cross sectional views of a conventional rotational disk implemented in a batch type implanter with a tilt angle to carry a plurality of wafers for performing a tilt angle implantation.
Figures 2A, 2B:
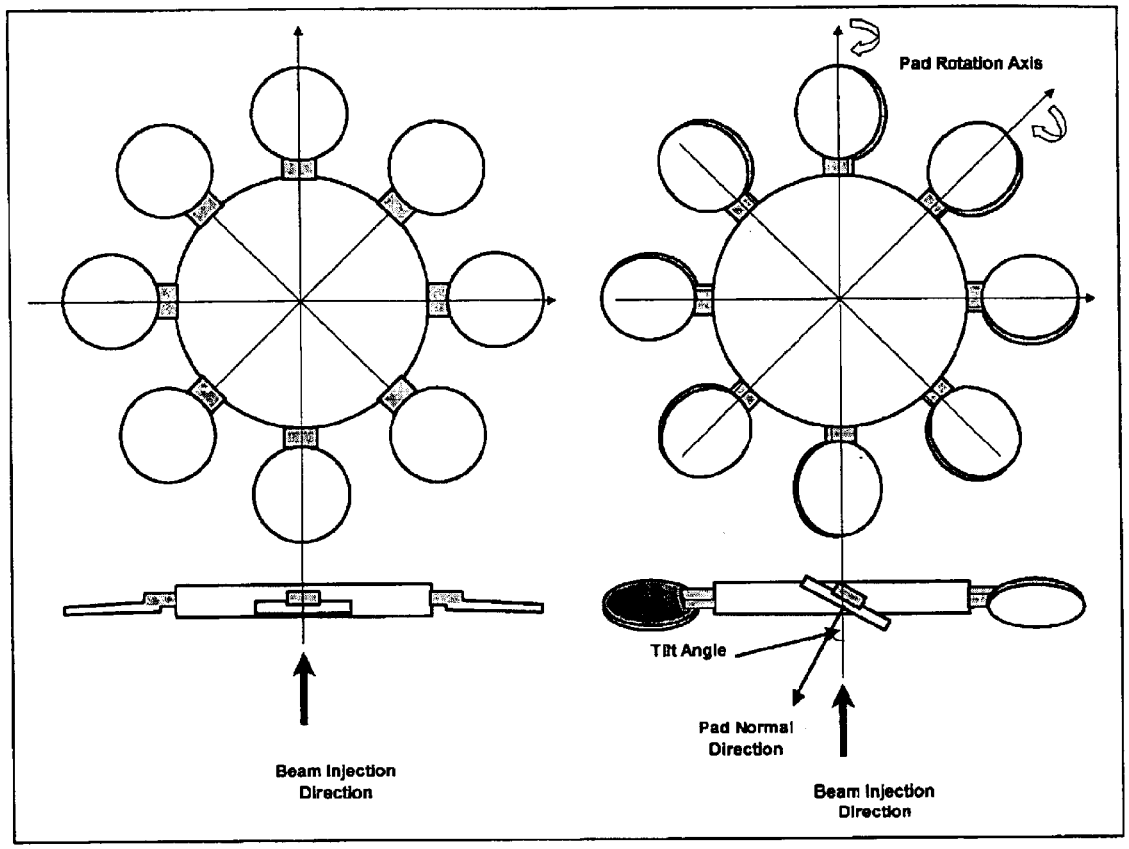
FIG. 2A shows a top view and a side cross sectional views of a conventional rotational disk implemented in a batch type implanter with rotational attachment wafer pads at zero degree tile angle to carry a plurality of wafers.
FIG. 2B shows a top view and a side cross sectional views of a conventional rotational disk implemented in a batch type implanter with rotational attachment wafer pads rotated to a tilt angle to carry a plurality of wafers for performing a tilt angle implantation.
Figure 3:
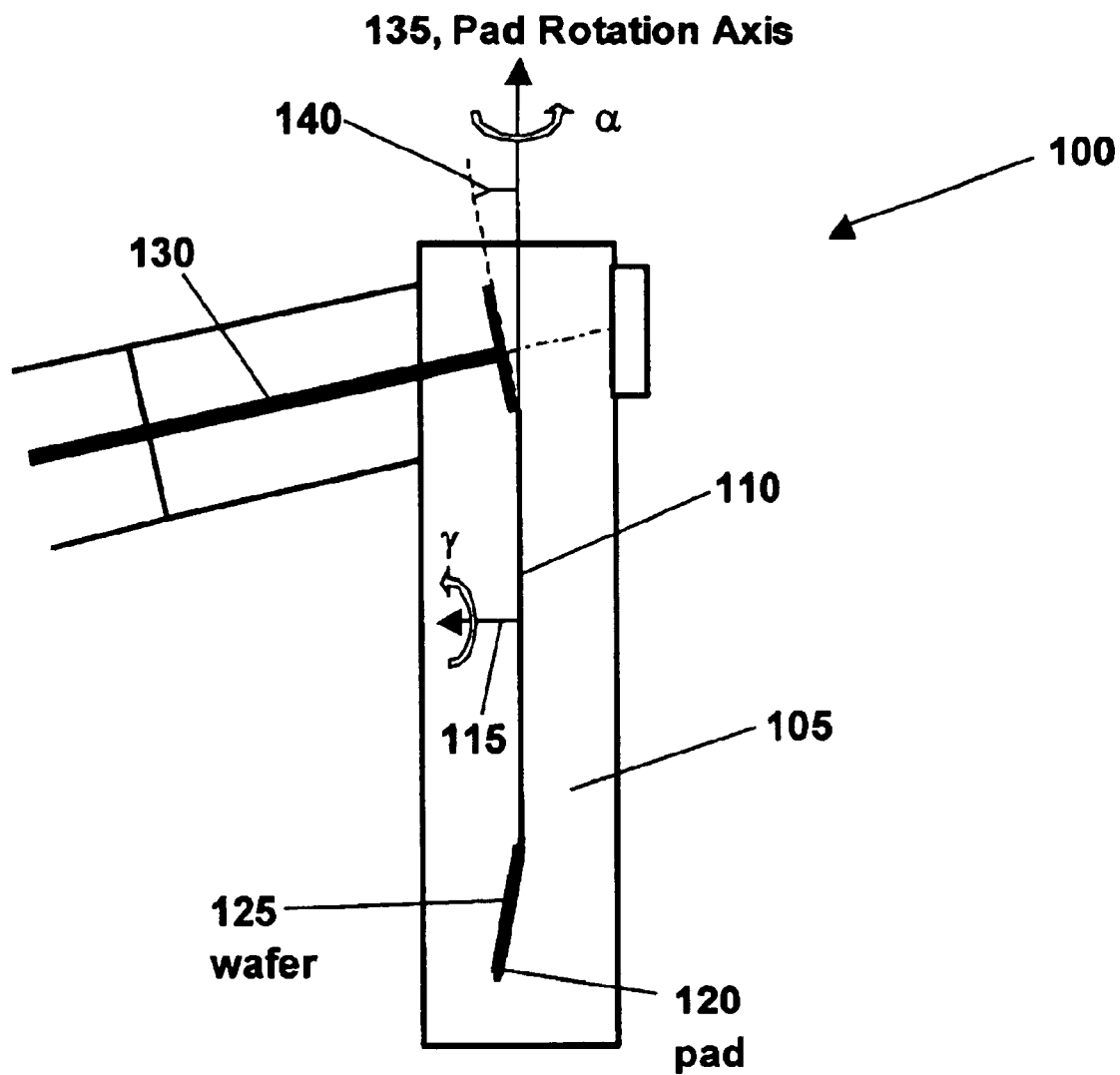
FIG. 3 is a functional block diagram to show an implanter of this invention.

FIG. 3 shows a functional block diagram of an ion implanter 100 that includes a target chamber 105 containing a hub 110 that supports a multiple attachment pads 120. During an ion implant operation the hub 110 is rotated along a hub rotation axis 115 and each of these attachment pads 120 can hold a substrate 125 securely thereon either when the hub 110 is rotating or stopped. The hub 110 also moves laterally to allow for flexibility such that all the substrates 125 held on the attachment pads 120 can be evenly and uniformly exposed to the implanting ions projected as ion beam 130 toward the substrates 125. Each of the attachment pads 120 is also rotated along a pad rotation axis 135. The pad rotation axis 135 and the hub rotation axis 115 are preferably perpendicular to each other as that also shown in FIG. 2, so that the pad rotation angle is similar to the implant tilt angle, and the pad rotation assembly, including vacuum seal and support bearings, is under symmetric force by the gravitational g-force during disk spin. Each of the substrates 125 placed on the attachment pads 120 has a concave surface and preferably having a natural bending shape of the substrates.

Figures 4A, 4B:
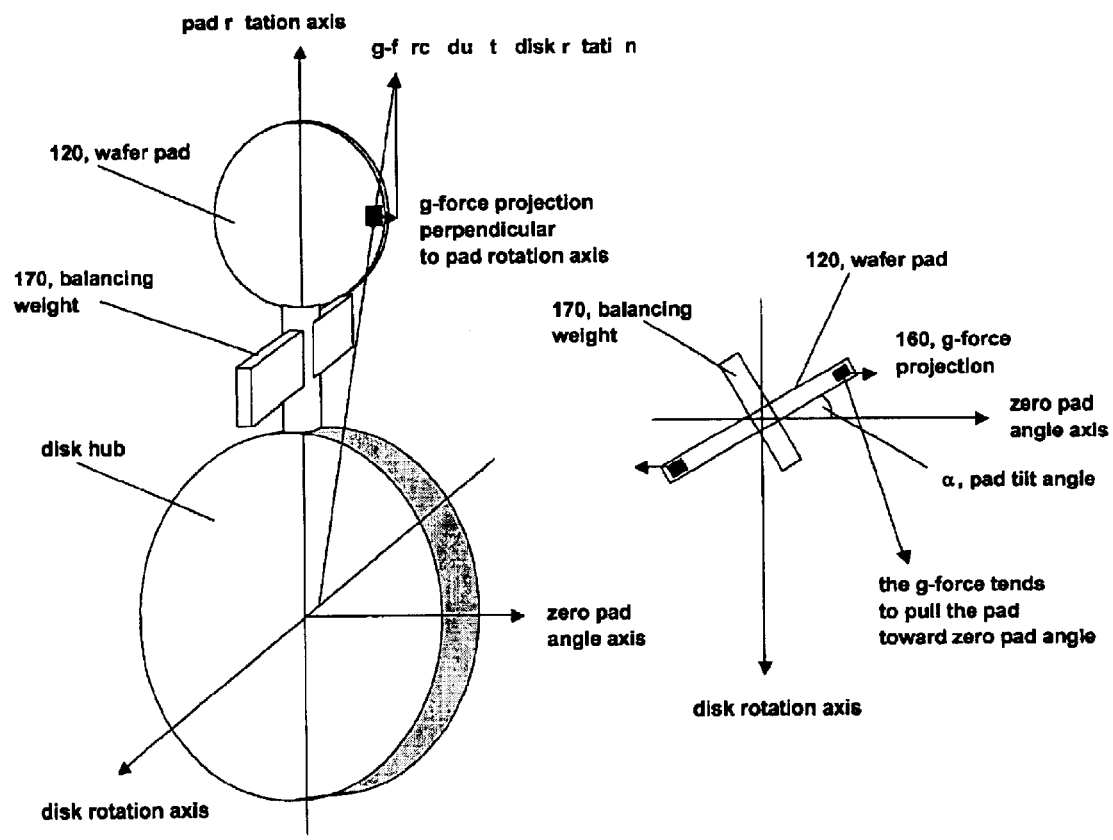
FIGS. 4A and 4B are illustrations to show a torque force asserted on a rotating pad on a disk to pull the pad back to a zero-degree rotation axis relative to the disk rotation axis.
Figure 9:
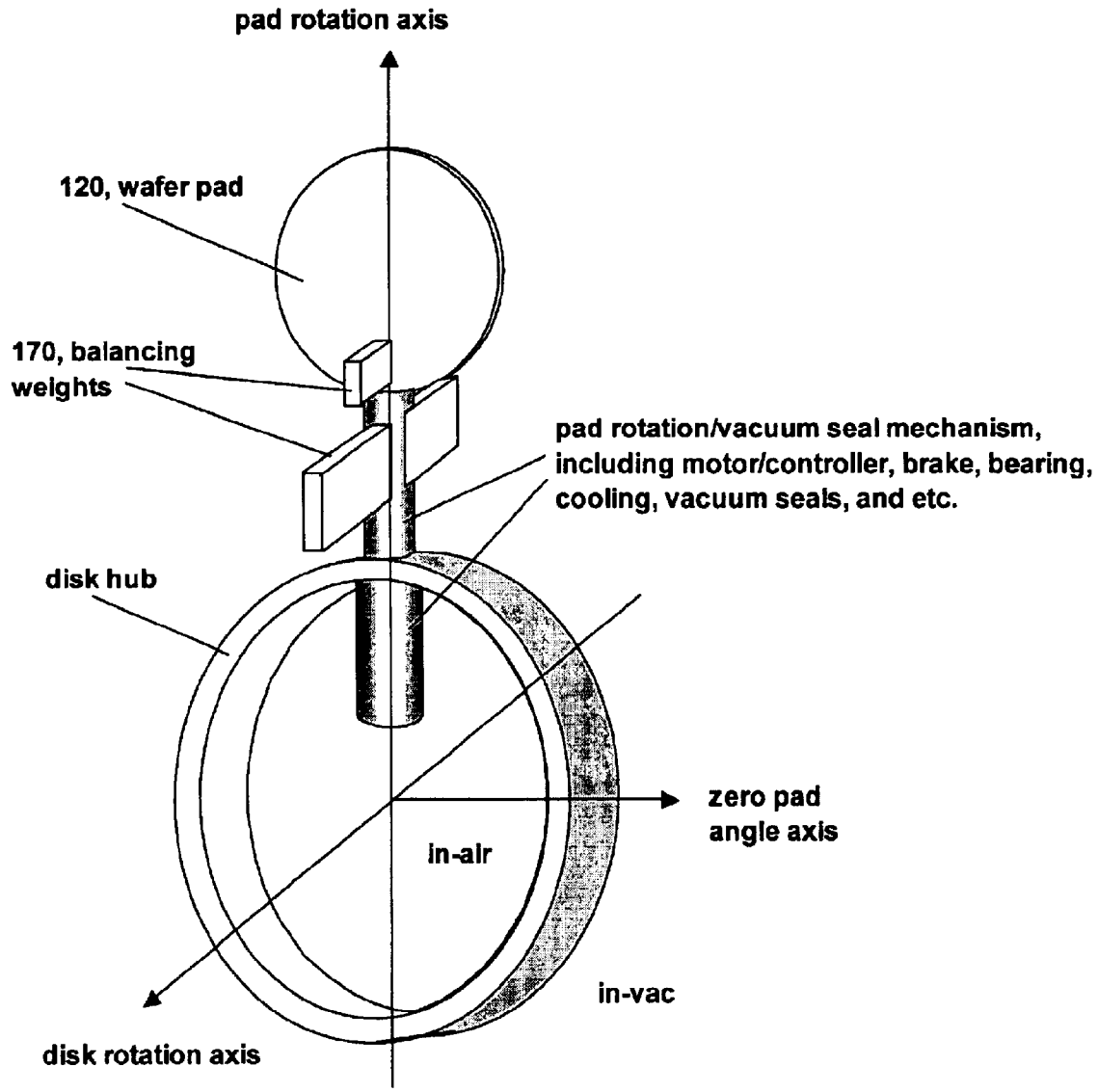
FIG. 9 illustrates a batch disk with individually rotational wafer pads having a balance masses disposed on each wafer pad.

Referring to FIGS. 4A and 4B for illustrating a toque asserted on a substrate 125 on a rotating disk 110 to pull the substrate 125 back toward a zero pad angle. When a wafer 125 placed on a wafer pad 120 continues to change the tilt angle from 0 to 45 degrees or higher, each wafer pad must have a mechanism to rotate the pad to a certain angular position and lock at that angular position to carry out an implant operation. For a thin and flat wafer pad, the centrifugal force when the disk spins during implant tends to rotate the pad toward a zero tilt angle. Assuming that the pedestal angle is zero and pad center is through the pad rotation axis and the pad thickness is much smaller than its width, the torque 160 acting on a pad 120 with tilt angle a can be approximately represented as:

$$\text{Torque} = (I\omega^2/2)\sin(2\alpha) = 2I\pi^2 f^2 \sin(2\alpha),$$

where I=integral(mass*distance-to-axis$^2$) is the pad rotation moment around the pad rotation axis, f is the disk spin speed. For an aluminum pad with 300 mm diameter and 10 mm thickness, the torque at f=10 Hz and tilt angle a=45 degrees is equal to 21 Nm, which is large enough to rotate the pad toward zero-tilt-angle direction if the locking force is not sufficient. To find a way to counter the g-force torque is essential for keeping the pad at the desired tilt angle to implement large angle implant. As will be described below in different embodiment, this invention provides the weight 170 (more details are shown in FIG. 9) to counter the centrifugal torque to keep the pad at any desired tilt angle while the disk spins at high speed.

Figure 5A:
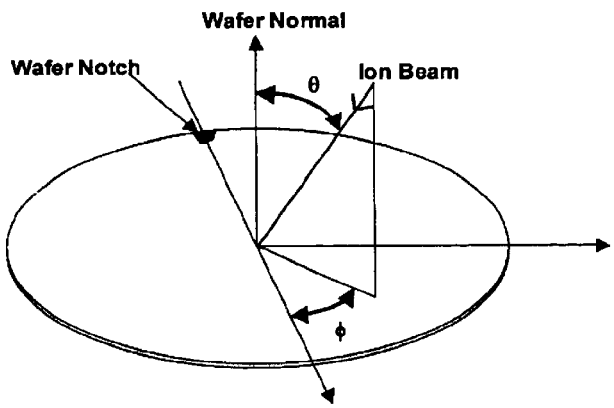
FIGS. 5A to 5C are illustrations to show the relationships between the tile angle and the twist angle.
Figure 5B:
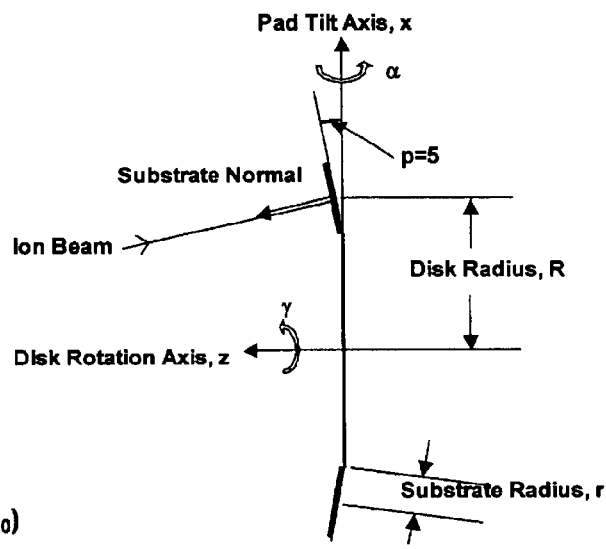
Figure 5C:
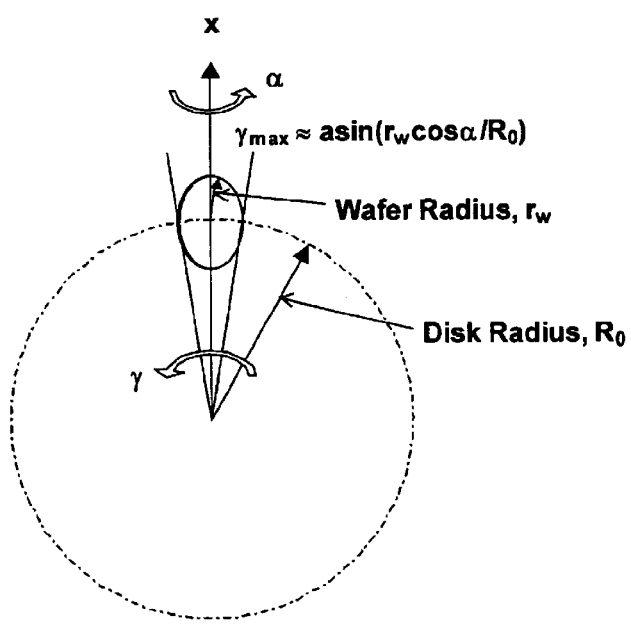

Referring to FIGS. 5A to 5C illustrating the angular relationships between the implanting ion beam 130, the disk 110, the wafer pads 120. When an ion beam 130 is incident onto a flat wafer pad surface, the relation between the pad rotation angle α, disk rotation angle γ, the disk pedestal angle p, the tilt angle θ, and twist angle φ as that shown in FIGS. 5A to 5C can be defined by the following equations:

$$\cos\theta = \sin^2 p\, \cos\gamma + \cos\alpha\, \cos^2 p - \sin\alpha\, \sin\gamma\, \cos p\, \sin p,$$

$$\sin\phi = (\sin\alpha\, \cos p + \cos\alpha\, \sin\gamma\, \sin p)/\sin\theta.$$

Figure 6A:
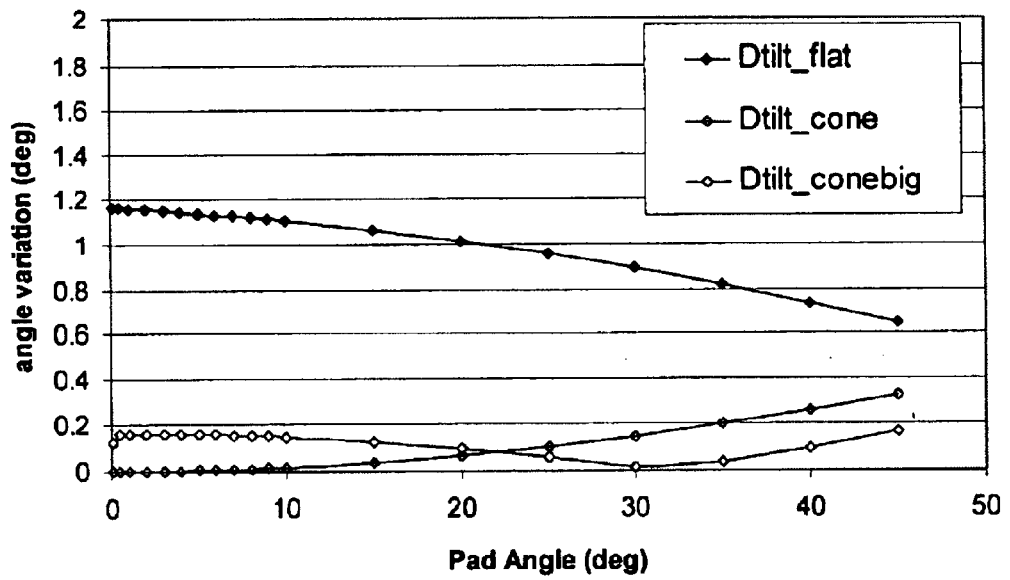
FIGS. 6A and 6B are diagram to show the analytical results of tilt angle and disk twist angle variations as the pad angle increases.

For a 13-pad 300 mm batch disk, the disk rotation angle γ variation is ~±13° cos α, i.e., since ±180°/13=±13.8°, when a pad goes across the incident ion beam from one wafer edge to the other during disk rotation. The resulting tilt and twist angle variation at different pad rotation angle α is shown in a curve #1 of FIG. 6A. The tilt angle variation Δθ is ±1.17° at α=0 to ±0.64° at α=45°. For advanced implant process, tilt angle variation near 1° may affect device performance. To minimize the tilt angle variation, the flat pad surface may be formed as a conical surface or a surface similar to a cone, such as a cylindrical surface.

By forming a wafer pad surface as a concaved conical surface with the cone axis coincide with the disk spin axis or alternatively at a distance of 65 cm from cone axis to wafer pad center, the tilt angle variation α=0. However, when the pad rotation angle increases to 45°, the tilt angle variation increases to ±0.33°, which is still a large number for some applications as that shown in curve 2 of FIG. 6A.

Choosing a pad surface with a curvature between the above cone shape and the flat surface may minimize the tilt angle variation across the whole pad rotation angle range (from 0 to 45°). When a wafer pad surface is conical with the cone axis that is 11 cm away from the disk spin axis, or having a distance of 76 cm from cone axis to wafer pad center, the tilt angle variation is controlled within ±0.16° and the zero angle variation is at α=30° as that shown in curve 3 of FIG. 6A.

Figure 6B:
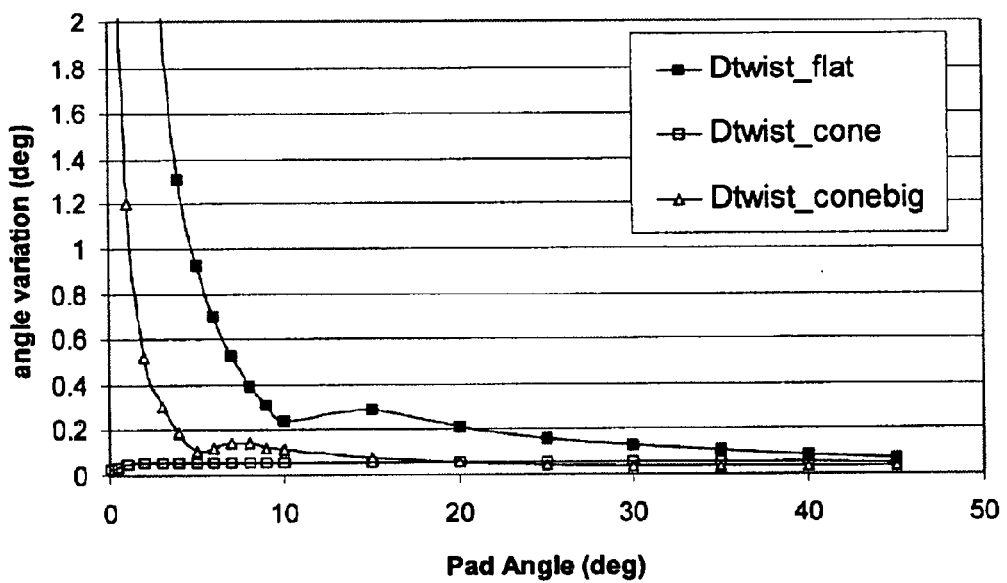

FIG. 6B shows that by choosing different concaved curvature pad shape also changes twist angle variation range as shown in FIG. 5b. There are many ways to make sure a wafer surface to follow the concaved pad surface. One is to use centrifugal force to press the wafer against the concaved pad surface. For a conical pad similar to the one in Curve #2, the experimental results showed that at about 500 rpm, the wafer was almost pressed against the conical pad surface with curvature error <±0.15°. The other method is to use electrostatic chuck to attract the wafer against the pad surface.

Figure 8:
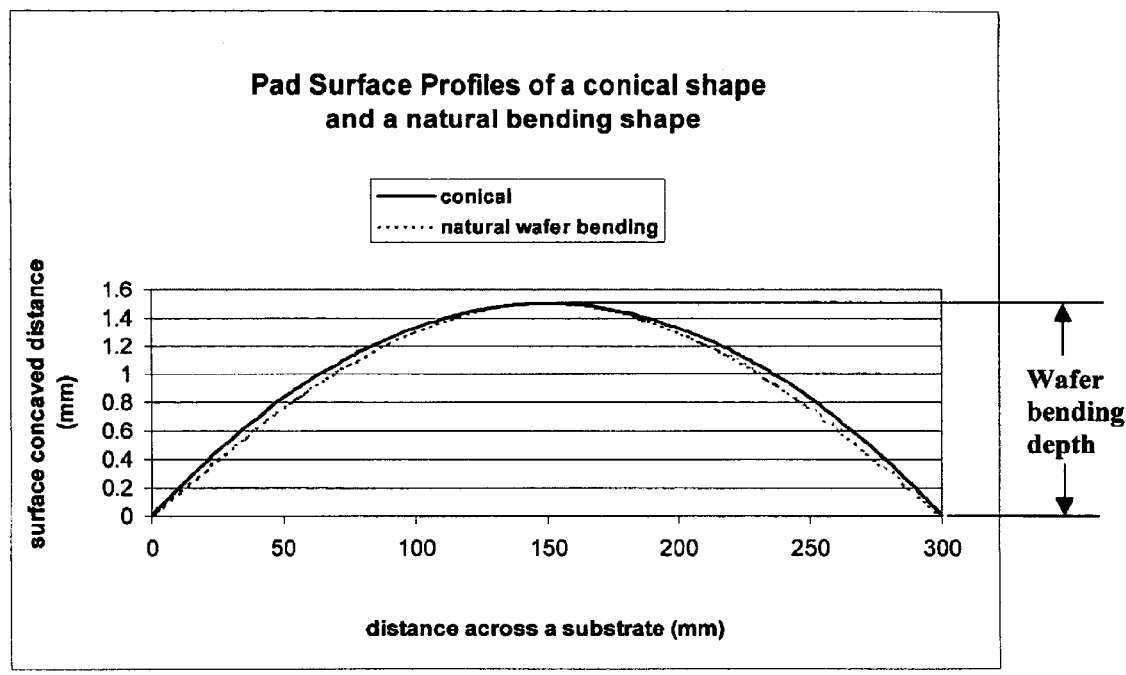
FIG. 8 is a diagram for showing the pad surface profile of a conical shape and a natural bending shape.

Although at low spin speed as 500 rpm, the wafer surface can be bent to a shape almost the same as the conical pad surface with error <±0.15°, and good enough to meet the implant angle variation requirement, it is not good enough to make sure the whole wafer is in good mechanical contact with the supporting conical pad surface. Under the centrifugal force (or g-force), the wafer is bent to its natural bending shape until its center portion touches the pad central surface. One of theoretical simulations shows that the wafer bending cross section can be described as the following curve, $$v = v_{max}[1 - (6/5)(x/d)^2 + (1/5)*(x/d)^4],$$

where $v_{max}$ is the maximum deformation at the center, and 2d is the wafer length, x=−d and d are two supporting points on wafer edges before the wafer is bent (v is 0 when x=d or −d). The difference between the natural bending shape and the conical shape can be seen in FIG. 8. For 300 mm conical pad, $v_{max}$=1.5 mm. When a wafer is bent naturally until its center portion touches the pad center, there are still gaps between the wafer and the pad surface in other portions. The maximum gap distance in FIG. 8 is about 70 um, which is a small number to affect implant angle integrity but a big number to affect thermal conductivity. In vacuum environment, heat generated on the wafer by the implanting ion beam will not flow through the 70 um vacuum gap into the pad, even the pad is coated by a soft elastomer film (a 200 um thick elastomer film can only be pressed down 1 um under 30 torr pressure (by comparison, the pressure on wafer from g-force is only 3 torr at 600 rpm). In order to minimize the 70 um gap, the spin speed of the disk is increased to reduce the gap between the wafer and the pad surface such that the gap is less than one micron. It is estimated that in order to reduce the gap under one micron, the spin speed will be over 2000 rpm. It is impossible in reality for a batch disk to rotate at this high speed due to mechanical limitation, such as disk balance, disk material strength, and possible wafer damage by clamp mechanism.

To deform a wafer into a concaved pad surface to maintain implant angle integrity and good thermal contact between the wafer and pad surface as well at relative low disk spin speed, the concaved pad surface has to follow the wafer natural bending shape, other than conical or cylindrical shape. The curve as mentioned above is one example of the natural bending shape. In general, the natural bending shape should follow $$v = v_{max}[1 + A(x/d)^2 + B*(x/d)^4 + C(x/d)^6 + \ldots],$$

and meet boundary conditions of v=0 at x=±d, and A≠0, B≠0. In practice, it may be required to modify these parameters to make sure the best thermal contact between wafers and pad surfaces.

The invention therefore provides methods and special disk/pad configurations for a batch type implanter to apply large angle implant. The new disk/pad arrangements provide mechanism to rotate each pad to a large angle and lock it in place firmly against the large centrifugal torque trying to rotate the pad back to zero tilt angle, to minimize pad rotation error. Furthermore, this invention provides a method to concave into a wafer surface to follow a concaved pad surface similar to the wafer natural bending shape, with maximum deformation the same as the desired conical pad surface which gives minimal tilt/twist angle variation, to minimize tilt/twist angle variation during disk spinning and at the same time maximize thermal contact between the wafers and the concaved pad surfaces.

The first embodiment of present invention is to individually rotate each substrate pad of a batch disk to allow implant angle control. The second embodiment is to counter the centrifugal torque to keep the pad at any desired tilt angle while the disk spins at high speed. The methods to counter the centrifugal torque are i) add mass 170 to counter balance the pad mass and reduce the total torque on the whole pad assembly as that shown in FIG. 9;

ii) add brake to the rotation mechanism in the pad assembly so that the pad can not rotate due to mechanical friction force or lock-key;

iii) use motor to hold the pad assembly. The sum of the friction torque and the motor holding torque should be larger than the centrifugal torque.

Figure 7:
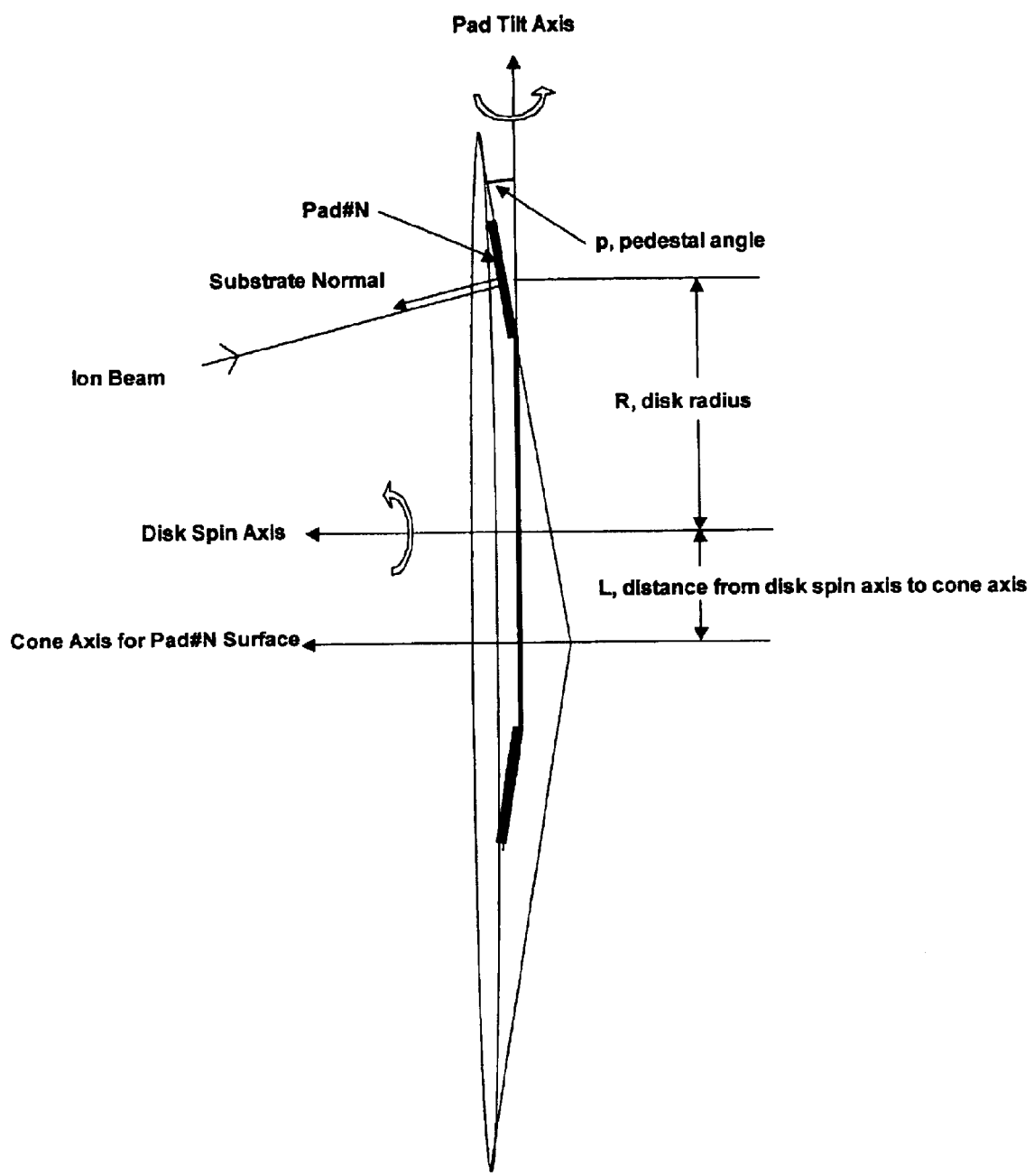
FIG. 7 is a side cross sectional view for showing the formation of a conical surface on a pad carried on a rotational disk.

The third embodiment is to prepare a pad surface that has concaved shape to minimize tilt/twist angle variation across a wafer at any desired pad angle or implant tilt angle range. The curvature of the concaved pad surface is conical or near conical with the conical surface line coincide with the pad's pedestal surface line as shown in FIG. 7. Each pad has its own conical surface with the distance between the cone axis and the disk spin axis equal to L. When L=0, the conical surfaces of all pads belong to the same cone, which is the commonly used conical surface for fixed pad disk application and can provide 0 tilt angle variation across a wafer during implant. However, when each pad rotates around its pad rotation axis to give different implant tilt angle, the tilt angle variation increases as the tilt angle as shown in curve #2 of FIG. 6A. By increasing L from 0 to a certain value, this invention enable a person of ordinary skill in the art to move the near-zero tilt angle variation region from tilt angle=0 to a larger tilt angle depending on the implant application, or to a larger tilt angle to minimize tilt angle variation across the whole implant angle range as shown in the curve #3 of FIG. 6A. A flat pad surface is only a special case where L is infinite large.

The fourth embodiment demonstrates a major different technique for shaping a concaved pad surface by forming a pad surface that has concaved shape following the substrate natural bending surface under centrifugal force to maximize contact area between the substrate and the pad surface to increase thermal conductivity. The natural bending surface, as that shown in FIG. 8, should be chosen as close as the desired conical surface to minimize implant angle variation. As emphasized above, using a concaved pad surface similar to the wafer natural bending shape is the optimal way to make sure good thermal contact between wafers and their supporting pads under practical disk spin speed (<1000 rpm).

This invention thus discloses a method to rotate individual pad of a batch disk to an implant angle and lock them in place, with the pad surface having a natural bending concaved surface to minimize the implant angle variation across a wafer on the pad for both tilt angle and twist angle, at large tilt angle implant. The implanter of this invention includes a disk with multiple attached pads that can hold substrates securely when the hub is at rest or rotates. The disk rotates around its spin axis, which moves laterally at a programmed speed profile so that all substrates on the hub can get evenly touched by the fixed ion beam. The pad rotation axis is at an angle with the disk spin axis, and the angle is preferable 90 degrees. The nominal of the pad surface is at an angle, i.e., a tilt angle, relative to the incident ion beam. A rotation mechanism is applied to each individual pad to rotate the pad to the desired tilt angle. A locking mechanism is applied to each individual pad assembly to lock the pad at the desired tilt angle with minimum angle variation under high centrifugal force during fast disk spin. The locking mechanism includes: a) add brake to the rotation mechanism in the pad assembly so that the pad can not rotate due to mechanical friction force or lock-key. B) use motor to hold the pad assembly. The sum of the friction torque and the motor holding torque should be larger than the centrifugal torque. A torque balancing mechanism is applied to pad mechanical design to minimize the total pad rotation torque under centrifugal force during fast disk spin by adding mass to counter balance the original wafer pad mass. The counter weight thus minimizes the torque that the locking mechanism has to overcome.

The surface of each substrate pad is concaved and preferable the natural bending shape of implanted wafers, e.g. silicon wafers, under g-force of a disk with attached pads at desired pedestal angle. The pedestal angle of each pad, i.e., the angle between the nominal pad surface and the hub rotation surface, is between 2 to 10 degrees, for purposes of holding wafers against pad surface under centrifugal force and minimizing implant angle variation across a wafer when the disk is spinning during implant process. There are two steps to choose the concaved pad surface. The first step is to choose a desired conical surface for each pad. The cone axis of the concaved pad surface can be the same as the disk spin axis or can be moved away from the disk spin axis to choose the minimum implant tilt angle variation range with a couple of examples: a) When the cone axis of the concaved pad surface is the same as the disk spin axis, the tilt angle variation across a 300 mm wafer for a 130 cm diameter disk can be <0.33 deg when the implant angle is less than 45 deg and twist angle variation can be <0.1 deg. The minimum tilt angle variation region (Δtilt<0.1 deg) is at tilt angle changing from 0 to 25 degree; b) When the cone axis is 11 cm away from the disk spin axis, the tilt angle variation across a 300 mm wafer for a 130 cm diameter disk can be <0.17 degree when the implant angle is less than 45 degrees and twist angle variation can be <0.5 degree for tilt angle >2 degrees. The minimum tilt angle variation region (Δtilt<0.1 degree) is at tilt angle changing from 20 to 40 degrees. The second step is to choose a surface that is the same as the wafer natural bending shape when the wafer is placed on the desired conical surface chosen in the first step and is under a g-force when the disk spins at the desired speed, e.g. 600 rpm.

According to above descriptions, this invention discloses an ion implanter that includes a rotating disk includes a plurality of rotating wafer pads wherein each of the rotating wafer pads further rotating along an independent wafer-pad rotating axis and at least one of the rotating wafer pad disposed at a tilt angle relative to the rotating disk. In a preferred embodiment, at least one of the rotating wafer pad further includes a balancing weight for countering a torque acted upon the rotating wafer pad by the rotating disk. In another preferred embodiment, at least one of the rotating wafer pad is a concaved wafer pad. In another preferred embodiment, at least one of the rotating wafer pad is a flat wafer pad. In another preferred embodiment, at least one of the rotating wafer pad further includes a brake to stop the rotating wafer pad from a rotation. In another preferred embodiment, at least one of the rotating wafer pad further includes a pad motor for holding and rotating the wafer pad along a wafer-pad rotating axis. In another preferred embodiment, a disk controller for controlling the rotating disk. In another preferred embodiment, the disk controller further controlling a rotational speed and rotational angle of the rotating disk. In another preferred embodiment, the implanter further includes a pad controller for controlling the rotating wafer pad. In another preferred embodiment, the pad controller further controlling a rotational speed and rotational In another preferred embodiment, at least one of the rotating wafer pad further includes a concaved wafer pad having a concave surface substantially conforming to a naturally bending surface of a wafer disposed on the rotating wafer pad. In another preferred embodiment, the concave surface having a depth substantially similar to a conical surface with a cone angle similar to the rotating wafer pad aligned in a pedestal angle and a cone axis coinciding with a rotation axis of the rotating disk for reducing a pad tilt angle variation during an implantation when a pad tilt angle is near zero. In another preferred embodiment, the concave surface having a depth substantially similar to a conical surface with a cone angle similar to the rotating wafer pad aligned in a pedestal angle and a cone axis coinciding with a rotation axis of the rotating disk for reducing a pad tilt angle variation during an implantation when a pad tilt angle varying from 0 to 20 degrees. In another preferred embodiment, the concave surface having a depth substantially similar to a conical surface with a cone angle similar to the rotating wafer pad aligned in a pedestal angle and a cone axis parallel with and disposing at a distance from a rotation axis of the rotating disk for reducing a pad tilt angle variation during an implantation when a pad tilt angle varying in a designated range. In another preferred embodiment, the concave surface having a depth substantially similar to a conical surface with a cone angle similar to the rotating wafer pad aligned in a pedestal angle and a cone axis parallel with and disposing at a distance of approximately 11 centimeters from a rotation axis of the rotating disk for reducing a pad tilt angle variation during an implantation when a pad tilt angle varying in a range of twenty to forty-five degrees for a rotating disk supporting 13 rotating wafer pads each of holding a 300 mm wafer having a pedestal angle of five degrees.

This invention further discloses an ion implanter that includes a rotating disk that has a plurality of rotating wafer pads wherein each of the rotating wafer pads further includes a weight for countering a torque by the rotating disk.

This invention further discloses a method of carrying out an ion implantation that includes a step of disposing a plurality of a rotating wafer pads on a rotating disk and disposing a balancing weight for countering a torque asserting on the rotating wafer pads by the rotating disk. This invention also discloses a method of carrying out an ion implantation that includes a step of disposing a plurality of a rotating wafer pads on a rotating disk and controlling each of the wafer pads to rotate along an independent wafer-pad rotating axis. In another embodiment, the method further includes a step of disposing at least one of the rotating wafer pad at a tilt angle relative to the rotating disk. In another embodiment, the method further includes a step of disposing on at least one of the rotating wafer pads a balancing weight for countering a torque acted upon the rotating wafer pad by the rotating disk. In another embodiment, the step of controlling the wafer pads further includes a step of controlling the wafer-pad to rotate along a rotating axis substantially perpendicular to a rotating axis of the rotating disk. In another embodiment, the step of disposing a plurality of a rotating wafer pads on a rotating disk further includes a step of disposing at least a concaved wafer pad on the rotating disk. In another embodiment, the step of disposing a plurality of a rotating wafer pads on a rotating disk further includes a step of disposing at least a flat wafer pad on the rotating disk. In another embodiment, the method further includes a step of disposing a brake on at least one of the rotating wafer pad to stop the rotating wafer pad from a rotation. In another embodiment, the step the method further includes a step of disposing a pad motor on at least one of the rotating wafer pad for holding and rotating the wafer pad along a wafer-pad rotating axis. In another embodiment, the step the method further includes a step of employing a disk controller for controlling the rotating disk. In another embodiment, the step of controlling the rotating disk further includes a step of controlling a rotational speed and rotational angle of the rotating disk. In another embodiment, the step the method further includes a step of employing a pad controller for controlling the rotating pad. In another embodiment, the step of controlling the rotating pad further includes a step of controlling a rotational speed and rotational angle of the rotating pad. In another embodiment, the step of disposing a plurality of rotating wafer pads on a rotating disk further includes a step of disposing at least a concaved wafer pad having a concave surface substantially conforming to a naturally bending surface of a wafer disposed on the rotating wafer pad.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. An ion implanter comprising:

a rotating disk comprising a plurality of rotating wafer pads wherein each of said rotating wafer pads further rotating along an independent wafer-pad rotating axis.

2. The ion implanter of claim 1 wherein:

at least one of said rotating wafer pad disposed at a tilt angle relative to said rotating disk.

3. The ion implanter of claim 1 wherein:

at least one of said rotating wafer pad further comprising a balancing weight for countering a torque acted upon said rotating wafer pad by said rotating disk.

4. The ion implanter of claim 1 wherein:

said wafer-pad rotating axis is substantially perpendicular to a rotating axis of said rotating disk.

5. The ion implanter of claim 1 wherein:

at least one of said rotating wafer pad is a concaved wafer pad.

6. The ion implanter of claim 1 wherein:

at least one of said rotating wafer pad is a flat wafer pad.

7. The ion implanter of claim 1 wherein:

at least one of said rotating wafer pad further comprising a brake to stop said rotating wafer pad from a rotation.

8. The ion implanter of claim 1 wherein:

at least one of said rotating wafer pad further comprising a pad motor for holding and rotating said wafer pad along a wafer-pad rotating axis.

9. The ion implanter of claim 1 further comprising:

a disk controller for controlling said rotating disk.

10. The ion implanter of claim 9 wherein:

said disk controller further controlling a rotational speed and rotational angle of said rotating disk.

11. The ion implanter of claim 1 further comprising:

a pad controller for controlling said rotating wafer pad.

12. The ion implanter of claim 11 wherein:

said pad controller further controlling a rotational speed and rotational angle of said rotating pad.

13. The ion implanter of claim 1 wherein:

at least one of said rotating wafer pad further comprising a concaved wafer pad having a concave surface substantially conforming to a naturally bending surface of a wafer disposed on said rotating wafer pad.

14. The ion implanter of claim 13 wherein:

said concave surface having a depth substantially similar to a conical surface with a cone angle similar to said rotating wafer pad aligned in a pedestal angle and a cone axis coinciding with a rotation axis of said rotating disk for reducing a pad tilt angle variation during an implantation when a pad tilt angle is near zero.

15. The ion implanter of claim 13 wherein:

said concave surface having a depth substantially similar to a conical surface with a cone angle similar to said rotating wafer pad aligned in a pedestal angle and a cone axis coinciding with a rotation axis of said rotating disk for reducing a pad tilt angle variation during an implantation when a pad tilt angle varying from 0 to 20 degrees.

16. The ion implanter of claim 13 wherein:

said concave surface having a depth substantially similar to a conical surface with a cone angle similar to said rotating wafer pad aligned in a pedestal angle and a cone axis parallel with and disposing at a distance from a rotation axis of said rotating disk for reducing a pad tilt angle variation during an implantation when a pad tilt angle varying in a designated range.

17. The ion implanter of claim 13 wherein:

said concave surface having a depth substantially similar to a conical surface with a cone angle similar to said rotating wafer pad aligned in a pedestal angle and a cone axis parallel with and disposing at a distance of approximately 11 centimeters from a rotation axis of said rotating disk for reducing a pad tilt angle variation during an implantation when a pad tilt angle varying in a range of twenty to forty-five degrees for a rotating disk supporting 13 rotating wafer pads each of holding a 300 mm wafer having a pedestal angle of five degrees.

18. An ion implanter comprising:

a rotating disk comprising a plurality of rotating wafer pads wherein each of said rotating wafer pads further comprising a weight for countering a torque by said rotating disk.

19. A method of carrying out an ion implantation comprising:

disposing a plurality of a rotating wafer pads on a rotating disk and disposing a balancing weight for countering a torque asserting on said rotating wafer pads by said rotating disk.

20. A method of carrying out an ion implantation comprising:

disposing a plurality of a rotating wafer pads on a rotating disk and controlling each of said wafer pads to rotate along an independent wafer-pad rotating axis.

21. The method of claim 20 further comprising:

disposing at least one of said rotating wafer pad at a tilt angle relative to said rotating disk.

22. The method of claim 20 further comprising:

disposing on at least one of said rotating wafer pads a balancing weight for countering a torque acted upon said rotating wafer pad by said rotating disk.

23. The method of claim 20 wherein:

said step of controlling said wafer pads further comprising a step of controlling said wafer-pad to rotate along a rotating axis substantially perpendicular to a rotating axis of said rotating disk.

24. The method of claim 20 wherein:

said step of disposing a plurality of a rotating wafer pads on a rotating disk further comprising a step of disposing at least a concaved wafer pad on said rotating disk.

25. The method of claim 20 wherein:

said step of disposing a plurality of a rotating wafer pads on a rotating disk further comprising a step of disposing at least a flat wafer pad on said rotating disk.

26. The method of claim 20 further comprising:

disposing a brake on at least one of said rotating wafer pad to stop said rotating wafer pad from a rotation.

27. The method of claim 20 further comprising:

disposing a pad motor on at least one of said rotating wafer pad for holding and rotating said wafer pad along a wafer-pad rotating axis.

28. The method of claim 20 further comprising: employing a disk controller for controlling said rotating disk.

29. The method of claim 28 wherein:

said step of controlling said rotating disk further comprising a step of controlling a rotational speed and rotational angle of said rotating disk.

30. The method of claim 20 further comprising:

employing a pad controller for controlling said rotating pad.

31. The method of claim 30 wherein:

said step of controlling said rotating pad further comprising a step of controlling a rotational speed and rotational angle of said rotating pad.

32. The method of claim 20 wherein:

said step of disposing a plurality of rotating wafer pads on a rotating disk further comprising a step of disposing at least a concaved wafer pad having a concave surface substantially conforming to a naturally bending surface of a wafer disposed on said rotating wafer pad.

* * * * *